(12) United States Patent
Gotoh et al.

(10) Patent No.: US 7,560,781 B2
(45) Date of Patent: Jul. 14, 2009

(54) SEMICONDUCTOR DEVICE AND FABRICATION METHOD THEREOF

(75) Inventors: Toshihisa Gotoh, Fukuyama (JP); Kenichi Azuma, Fukuyama (JP); Kouichi Takeuchi, Ibara (JP); Akiyoshi Mutoh, Fukuyama (JP)

(73) Assignee: Sharp Kabushiki Kaisha, Osaka (JP)

( * ) Notice: Subject to any disclaimer, the term of this patent is extended or adjusted under 35 U.S.C. 154(b) by 113 days.

(21) Appl. No.: 11/651,617

(22) Filed: Jan. 10, 2007

(65) Prior Publication Data

US 2007/0178638 A1    Aug. 2, 2007

(30) Foreign Application Priority Data

Jan. 13, 2006    (JP)    ................ 2006-006671

(51) Int. Cl.
*H01L 29/76*    (2006.01)
(52) U.S. Cl. ................ 257/369; 257/374; 438/221
(58) Field of Classification Search ................ 257/369, 257/374, 510; 438/221
See application file for complete search history.

(56) References Cited

U.S. PATENT DOCUMENTS

| | | | |
|---|---|---|---|
| 4,729,006 A * | 3/1988 | Dally et al. ................ 257/372 |
| 6,037,237 A | 3/2000 | Park et al. | |
| 6,297,128 B1 | 10/2001 | Kim et al. | |
| 6,882,025 B2 * | 4/2005 | Yeo et al. ................ 257/510 |
| 7,244,643 B2 * | 7/2007 | Ishitsuka et al. ............ 438/199 |
| 2004/0126990 A1 | 7/2004 | Ohta | |
| 2006/0091475 A1 * | 5/2006 | Fujii et al. ................ 257/374 |

FOREIGN PATENT DOCUMENTS

| | | |
|---|---|---|
| KR | 1998-084173 A | 12/1998 |
| KR | 1999-011953 A | 2/1999 |
| KR | 10-2006-0000483 A | 1/2006 |

OTHER PUBLICATIONS

Nikkei Microdevices, Microdevices Inside LSI, pp. 57 and 60, May 2005.

* cited by examiner

*Primary Examiner*—Mark Prenty
(74) *Attorney, Agent, or Firm*—Nixon & Vanderhye P.C.

(57) ABSTRACT

A semiconductor device includes a first insulating layer and a second insulating layer in a trench. The first insulating layer insulates two MOSFETs from each other, and the second insulating layer has a true stress opposite to a true stress of the first insulating layer. The second insulating layer includes two regions of different true stresses. This enables a drain current flow in each MOSFET to be independently controlled in a semiconductor device that employs a STI method for element isolation.

13 Claims, 9 Drawing Sheets

SEMICONDUCTOR DEVICE AND FABRICATION METHOD THEREOF

This Nonprovisional application claims priority under 35 U.S.C. § 119(a) on Patent Application No. 006671/2006 filed in Japan on Jan. 13, 2006, the entire contents of which are hereby incorporated by reference.

FIELD OF THE INVENTION

The present invention relates to a semiconductor device and a fabrication method of a semiconductor device. Particularly, the invention relates to a semiconductor device with shallow trench isolation (STI), and a fabrication method of such a semiconductor device.

BACKGROUND OF THE INVENTION

There have been ongoing developments in the microfabrication of semiconductor devices. Along with this, the resolution of LSI has been improving according to the scaling law. Microfabrication of semiconductor devices involves not just smaller element size, but the size of an element isolation region for isolating elements is reduced as well.

As a technique of element isolation, a method known as LOCOS (Local Oxidation of Silicon) has been commonly used. In the LOCOS method, a thermal oxidation film (field oxidation film) is formed only in the element isolation region, by taking advantage of the oxidation-tolerant property of a silicon nitride film.

However, the LOCOS method has a problem known as the "bird's beak." The "bird's beak" is a phenomenon in which the field oxidation film spreads to areas to be element regions. Where there is a bird's beak, the actual dimensions of element regions are smaller than the designed dimensions. A bird's beak can effectively be suppressed by reducing the amount of field oxidation. However, this is set against reduced element isolating power. Microfabrication of semiconductor elements has come to the level where it is now difficult to suppress bird's peak while at the same time sustain element isolating power. That is, the LOCOS method has almost seen its limit.

A recent alternative to the LOCOS method is an element isolation method known as STI (Shallow Trench Isolation), intended to suppress bird's beak. Briefly, the STI method forms a trench (groove) by etching a surface of a semiconductor substrate. This is followed by formation of an isolation film (insulating layer) in the trench. The isolation film is then planarized to achieve element isolation. An advantage of this method is that it provides a good element isolating power by allowing the size (depth) of the trench to be increased along a direction perpendicular to the substrate surface. The method also suppresses the lateral spread of the isolation film. As a result, a semiconductor device is realized that has good element isolating power and allows for microfabrication. That is, by the element isolation employing the STI method, fabrication of semiconductor devices with an improved level of integration is possible.

In the STI method, a silicon oxide film is commonly used as the isolation film embedded in the trench. In order to improve density of the silicon oxide film, the silicon oxide film is subjected to a heat treatment after embedding it in the trench. However, owning to the fact that the silicon oxide film and the semiconductor substrate are made of different materials, the heat treatment causes a compressive load applied on the channel region of the semiconductor substrate. This generates a compressive stress in the channel region. The compressive stress strains the Si lattices in the channel region. This decreases electron mobility. As a result, the drain current of MOSFET is reduced. The influence of compressive stress becomes prominent as the size of element-forming region is reduced by the microfabrication of elements.

A solution to the problem of compressive stress is described in Japanese Laid-Open Patent Publication No. 2004-207564 (published on Jul. 22, 2004, corresponding US Patent Publication US2004/0126990 A1). This publication teaches canceling the compressive stress of the silicon oxide film by the tensile stress of the silicon nitride film formed in the trench, as shown in FIGS. 5(a) through 5(h).

With reference to FIGS. 5(a) through 5(h), the following will describe a conventional semiconductor device and a fabrication method. FIGS. 5(a) through 5(h) are cross sectional views illustrating fabrication steps of the semiconductor device. FIG. 5(h) is also a cross section representing a structure of the conventional semiconductor device.

First, as shown in FIG. 5(a), a silicon oxide film 111 and a silicon nitride film 112 are deposited on a surface of the silicon substrate 110. The silicon nitride film 112 is then coated with a resist film (not shown), and an element-isolating pattern 113 is formed by exposure and development. The element-isolating resist pattern 113 is formed on an element-forming region (active region), and an opening defines an element isolation region.

Then, as shown in FIG. 5(b), the silicon nitride film 112, the silicon oxide film 111, and the semiconductor substrate 110 are successively etched to form an element-isolating trench 126, using the resist pattern 113 as a mask.

Thereafter, the resist pattern 113 is removed. As shown in FIG. 5(c), the surface of the silicon substrate exposed in the trench is subjected to thermal oxidation to form a silicon oxide film 114. Then, a silicon nitride film 115 is formed to cover the silicon oxide films 114 and 111, and the silicon nitride film 112.

Next, as shown in FIG. 5(d), a silicon oxide film 116 is formed to completely fill the trench 126.

Then, as shown in FIG. 5(e), surface irregularities on the silicon oxide film 116 are improved by chemical machine polishing, without exposing the silicon nitride film 115. The silicon oxide film 116 is then etched back.

Next, as shown in FIG. 5(f), the exposed portion of the silicon nitride film 115 is removed by a phosphoric acid ($H_3PO_4$) boil.

Next, as shown in FIG. 5(g), a silicon oxide film 117 formed by a chemical vapor deposition (CVD) method is deposited on the entire surface on the film-bearing side of the semiconductor substrate 110, so as to fill the trench 126. This is followed by planarization etching by chemical machine polishing, which exposes the surface of the silicon nitride film 112 in the element-forming region.

Thereafter, as shown in FIG. 5(h), the silicon nitride film 112 is removed by a phosphoric acid ($H_3PO_4$) boil, followed by removal of the silicon oxide film 111 with hydrofluoric acid. Next, well implantation is performed to form a well region 118 and a well region 119. This is followed by formation of a gate oxidizing film 120 and a gate electrode 21. Then, by source and drain implantation, a source region and a drain region 122 are formed.

In the conventional technique, the compressive load applied on the channel-forming region of the element-forming region is reduced by the tensile stress of the silicon nitride film 115. This increases the electron mobility in the N-channel MOSFET among the MOSFETs adjoining the trench 126, as compared with the case where the silicon nitride film 115 is not provided.

In the P-channel MOSFET, however, reducing the compressive load decreases the hole mobility as compared with the case where the silicon nitride film 116 is not provided. This reduces the drain current. The reduced drain current in the MOSFET slows the response speed of the MOSFET.

SUMMARY OF THE INVENTION

An object of the present invention is to enable a drain current flow in each MOSFET to be independently controlled in a semiconductor device that employs the STI method for element isolation. The invention also provides a fabrication method of such a semiconductor device.

In order to achieve the foregoing object, a semiconductor device according to the present invention includes: a semiconductor substrate; a trench formed on the semiconductor substrate; at least two MOSFETs provided on the semiconductor substrate with the trench in between; a first insulating layer, provided in the trench, insulating the MOSFETs; and a second insulating layer, provided at least between the first insulating layer and the MOSFETs, having a true stress opposite to a true stress of the first insulating layer, the true stress of the second insulating layer being different in (i) a region formed between one MOSFET and the first insulating layer and (ii) a region formed between another MOSFET and the first insulating layer.

According to this structure, the true stress of the second insulating layer relieves the applied load on each MOSFET originating in the true stress of the first insulating layer. This relieves the stress generated in each MOSFET.

The load applied on each MOSFET is dependent on the sum of true stresses of the first insulating layer and the second insulating layer. According to this structure, the true stress of the second insulating layer differs in (i) a region formed between one MOSFET and the first insulating layer and (ii) a region formed between another MOSFET and the first insulating layer. This enables different loads to be applied on different MOSFETs. That is, a generated stress in each MOSFET can be independently controlled. This allows the drain current to be controlled in each MOSFET, thereby controlling the response speed of each MOSFET.

Further, a semiconductor device according to the present invention may be adapted to include: a semiconductor substrate; a trench formed on the semiconductor substrate; at least two MOSFETs provided on the semiconductor substrate with the trench in between; a first insulating layer, provided in the trench, insulating the MOSFETs; and a second insulating layer, provided at least between the first insulating layer and the MOSFETs, having a true stress opposite to a true stress of the first insulating layer, the true stress of the second insulating layer being different in (i) a region formed between one MOSFET and the first insulating layer and (ii) a region formed between another MOSFET, disposed on an opposite side of the trench, and the first insulating layer.

According to this structure, the true stress of the second insulating layer differs in (i) a region formed between one MOSFET and the first insulating layer and (ii) a region formed between another MOSFET, disposed on an opposite side of the trench, and the first insulating layer. This enables different loads to be applied on the two MOSFETs provided on both sides of the trench. That is, a generated stress in each MOSFET can be independently controlled. This allows the drain current to be controlled for each MOSFET, thereby controlling the response speed of each MOSFET.

A semiconductor device according to the present invention may be adapted to include: a semiconductor substrate; a trench formed on the semiconductor substrate; at least two MOSFETs provided on the semiconductor substrate with the trench in between; a first insulating layer, provided in the trench, insulating the MOSFETs; and a second insulating layer, provided at least between the first insulating layer and the MOSFETs, having a true stress opposite to a true stress of the first insulating layer, the at least two MOSFETs including a P-channel MOSFET and an N-channel MOSFET, and the true stress of the second insulating layer being different in (i) a region formed between the N-channel MOSFET and the first insulating layer and (ii) a region formed between the P-channel MOSFET and the first insulating layer.

According to this structure, the true stress of the second insulating layer differs in (i) a region formed between the N-channel MOSFET and the first insulating layer and (ii) a region formed between the P-channel MOSFET and the first insulating layer. This enables different loads to be applied on the N-channel MOSFET and the P-channel MOSFET. That is, a generated stress in each type of MOSFET can be independently controlled. This allows the drain current to be controlled for each MOSFET, thereby controlling the response speed of each MOSFET.

According to the present invention, there is provided a method for fabricating a semiconductor device in which a trench and at least two MOSFETs provided on both sides of the trench are formed on a semiconductor substrate, the method comprising the steps of: forming, in the trench, a first insulating layer having a true stress in a certain direction; forming, between the first insulating layer and inner walls of the trench, a second insulating layer having a true stress opposite the true stress of the first insulating layer, the step of forming a second insulating layer including a step of placing an insulating layer in the trench, and a step of varying a true stress in a portion of the insulating layer by a chemical reaction process.

According to this method, the stress-varying step forms regions of different true stresses in the second insulating layer.

Further, according to the foregoing method, regions of different true stresses in the second insulating layer are continuously formed by a chemical reaction process that is performed in portions of the second insulating layer, instead of forming separate insulating layers having different true stresses.

This simplifies the fabrication steps and improves productivity.

Additional objects, features, and strengths of the present invention will be made clear by the description below. Further, the advantages of the present invention will be evident from the following explanation in reference to the drawings.

DESCRIPTION OF THE EMBODIMENTS

The following will specifically describe one embodiment of the present invention. First, description will be made as to an embodiment of a semiconductor device, followed by a fabrication method of the semiconductor device.

<1> Semiconductor Device (1-1) Semiconductor Device 1

A semiconductor device according to one embodiment of the present invention includes: a semiconductor substrate; a trench formed on the semiconductor substrate; at least two MOSFETs provided on the semiconductor substrate with the trench in between; a first insulating layer, provided in the trench, insulating the MOSFETs; and a second insulating layer, provided at least between the first insulating layer and the MOSFETs, having a true stress opposite to that of the first insulating layer, the true stress of the second insulating layer being different in (i) a region formed between one MOSFET and the first insulating layer and (ii) a region formed between another MOSFET and the first insulating layer. The structure, material, and fabrication method of the semiconductor device are not particularly limited.

Figure 1:
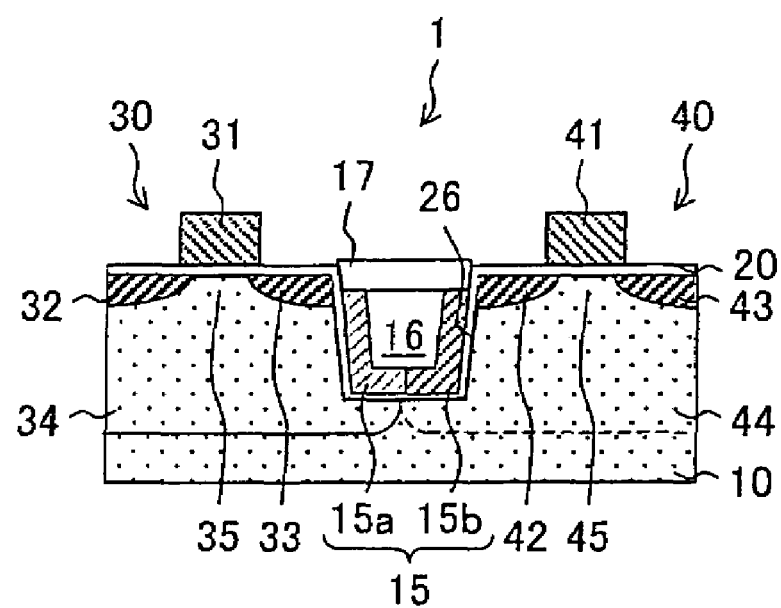
FIG. 1 is a cross sectional view showing one embodiment of a semiconductor device according to the present invention.

FIG. 1 is a cross sectional view showing a main structure of a semiconductor device according to one embodiment of the present invention.

FIG. 1 illustrates a semiconductor device 1 as one example of a semiconductor device according to the present embodiment. The semiconductor device 1 at least includes a trench 26 formed on a semiconductor substrate 10, and MOSFETs 30 and 40 formed on both side of the trench 26. The semiconductor device 1 further includes a first insulating layer 16, provided in the trench 26, for insulating the MOSFETs 30 and 40. The semiconductor device 1 also includes a second insulating layer 15. The second insulating layer 15 is formed between trench inner walls and the first insulating layer 16, along side surfaces of the trench 26 adjoining the MOSFETs 30 and 40.

Further, in the present embodiment, a silicon oxide film 17 is formed in the trench 26, in portions closer to the opening of the trench 26 than the first insulating layer 16 and the second insulating layer 15. Note that, the silicon oxide film 17 is not particularly limited, and various kinds of insulators can be used therefor.

In the description of the present embodiment, the surface of the semiconductor substrate 10 where the MOSFET is formed is referred to as an upper surface, and the other side of the semiconductor substrate 10 is referred to as a bottom surface.

In the present embodiment, the semiconductor substrate 10 is realized by a Si substrate. However, the semiconductor substrate is not particularly limited. For example, various kinds of semiconductor substrates, such as a GaAs substrate can be used.

Conventional MOSFETs can be used as the MOSFETs of the semiconductor device 1. The MOSFETs may be of a P-type or N-type.

The MOSFET 30, as one example of such MOSFETs, includes an impurity-doped well region 34 formed on the semiconductor substrate 10, a source region 32 and a drain region 33 formed on the well region 34, a channel region 35 disposed between the source region 32 and the drain region 33, and a gate electrode 31 provided on the channel region 33 with a gate insulating film 20 in between. Similarly, the MOSFET 40 includes a well region 44, a source region 42, a drain region 43, a channel region 45, and a gate electrode 41. As noted above, the MOSFETs 30 and 40 may be a combination of P-type and N-type transistors, or a combination of P-type transistors or N-type transistors.

When a load is applied on the MOSFETs 30 and 40, it generates a stress in the channel regions 35 and 45 in the MOSFETs 30 and 40. The stress determines a flow of drain current. As a measure of drain current flow, a saturated drain current is used. The influence of MOSFET stress on a drain current flow is particularly strong in the in-plane direction of the semiconductor substrate. The influence of the stress is even stronger in the direction of channel length.

The depth, width, and length of the trench 26 are not particularly limited as long as the trench 26, with the first insulating layer 16, can insulate the MOSFETs 30 and 40 to sustain the functionality of the semiconductor device 1.

The material or profiles of the first insulating layer 16 are not particularly limited as long as the first insulating layer 16 can insulate the MOSFETs 30 and 40. In the present embodiment, the first insulating layer 16 is continuously formed in the trench 26.

The material or profiles of the second insulating layer 15 are not particularly limited as long as the second insulating layer 15 is disposed between the first insulating layer 16 and the inner walls of the trench 26, and has a true stress opposite to that of the first insulating layer 16. As used herein, "the second insulating layer has a true stress opposite to that of the first insulating layer" refers to the situation where the second insulating layer 15 has a tensile stress when the first insulating layer 16 has a compressive stress, and the second insulating layer 15 has a compressive stress when the first insulating layer 16 has a tensile stress.

Further, as used herein "true stress" has the same meaning as "membrane stress".

The second insulating layer is also known as a "stress regulating film" because it regulates the stress generated in the MOSFET.

Thus, the stress generated in the MOSFETs 30 and 40 by the true stress of the first insulating layer 16 can be reduced by the true stress of the second insulating layer 15. That is, it is possible to reduce the influence of the true stress of the first insulating layer 16 on the drain current flow in the MOSFETs 30 and 40.

It is preferable that the second insulating layer 15 have a true stress opposite to that of the first insulating layer 16 particularly against the force acting in the in-plane direction of the semiconductor substrate 10. Further, it is preferable that the second insulating layer 15 have a true stress opposite to that of the first insulating layer 16 particularly against the force acting in the direction of a channel length of the MOSFETs 30 and 40. This further improves the counteracting effect of the second insulating layer 15 on the true stress of the first insulating layer 16 in reducing the influence applied stress on the drain current flow in the MOSFETs 30 and 40.

The second insulating layer 15 has a true stress opposite to the true stress of the first insulating layer 16 and that differs in magnitude in a region 15a, disposed between one of the MOSFETs and the first insulating layer 16, and a region 15b, disposed between the other MOSFET and the first insulating layer 16.

For example, the second insulating layer 15 of the present invention has a region 15a disposed between the first insulating layer 16 and the MOSFET 30, and a region 15b disposed between the first insulating layer 16 and the MOSFET 40.

With this construction, the sum of true stresses in the first insulating layer 16 and the region 15a differs from the sum of true stresses in the first insulating layer 16 and the region 15b. That is, different loads can be applied on the MOSFET 30 and the MOSFET 40. To put it more specifically, the semiconductor device 1 can independently regulate the applied load on the MOSFET 30 and the MOSFET 40.

This construction is particularly suitable when the MOSFETs 30 and 40 are a combination of N-channel and P-channel transistors.

The following describes the semiconductor device 1 of the present embodiment more specifically, based on a structure in which the MOSFET 30 is a P-channel MOSFET and the MOSFET 40 is an N-channel MOSFET.

As shown in FIG. 1, the second insulating layer 15 is continuously formed on the inner sidewall surfaces and inner bottom surface of the trench 26. The regions 15a and 15b of the second insulating layer 15 are formed on both sides of a boundary that extends through the bottom surface of the trench 26. That is, the region 15a and the region 15b are respectively formed on two inner wall surfaces of the trench 26 adjoining the MOSFETs 30 and 40, with the region 15a adjoining the MOSFET 30, and the region 15b adjoining the MOSFET 40.

Here, the first insulating layer 16 has a compressive stress, and the second insulating layer 15 has a tensile stress. In the second insulating layer 15, the region 15a has a smaller tensile stress than the region 15b.

It should be appreciated however that the present invention is not just limited to such a construction. For example, the first insulating layer 16 may have a tensile stress, and the second insulating layer 15 may have a compressive stress. In this case, the region 15a has a larger compressive stress than the region 15b.

The load exerted on the MOSFET 30 is dependent on the sum of true stresses of the first insulating layer 16 and the region 15a of the second insulating layer 15. The load exerted on the MOSFET 40 is dependent on the sum of true stresses of the first insulating layer 16 and the region 15b of the second insulating layer 15. With this construction, a greater compressive load is applied on the P-type MOSFET 30 than on the N-type MOSFET 40. This ensures a smooth drain flow in the P-type MOSFET 30. By the smaller compressive load, a smooth drain flow is also maintained in the MOSFET 40. In this manner, the MOSFETs 30 and 40 can be insulated from each other without preventing a smooth current flow therein.

In order to ensure a smooth drain current flow, it is preferable that a compressive load be applied on the P-channel MOSFET, and that a tensile load be applied on the N-channel MOSFET. It is therefore preferable that the absolute value of the tensile stress in the region 15a be smaller than the absolute value of the compressive stress in the first insulating layer 16. It is also preferable that the absolute value of the tensile stress in the region 15b be greater than the absolute value of the compressive stress in the first insulating layer 16.

Further, it is preferable that the absolute value of the compressive stress in the region 15a be greater than the absolute value of the tensile stress of the first insulating layer 16, when the first insulating layer 16 has a tensile stress and the second insulating layer 15 has a compressive stress. It is also preferable that the absolute value of the tensile stress in the region 15b be smaller than the absolute value of the compressive stress in the first insulating layer 16.

In the semiconductor device 1, an insulating layer with a compressive stress may be realized by a silicon oxide layer that contains, or is made of, dense silicon oxide prepared by a heat treatment. An insulating layer with a tensile stress may be realized by a silicon nitride film that contains, or is made of, silicon nitride. When the second insulating layer 15 has a tensile stress, a silicon nitride film is particularly preferable. This is because the silicon nitride film can readily vary a true stress by undergoing chemical reactions. Another advantage is that silicon nitride is easily available and easy to handle since it is a material widely used in common semiconductor processes.

In the second insulating layer 15, it is preferable that the true stress opposite to that of the first insulating layer 16 vary in a range of 500 Pa and 3 GPa between the region 15a and the region 15b. This is because a true stress difference equal to or greater than 500 Pa enables application of stresses that are suited for each MOSFET, and because a true stress difference greater than 3 GPa does not bring any notable characteristic changes and does not produce any sizable effects.

The silicon nitride (SiN) film contains hydrogen atoms in the form of Si—H and N—H groups. The hydrogen content influences the true stress. When the second insulating layer 15 is a silicon nitride film, it is preferable that a hydrogen-content difference between the region 15a and the region 15b fall in a range of 5% to 25%. This is because a hydrogen-content difference equal to or greater than 5% maintains the true stress difference below 3 GPa, and because a hydrogen-content difference equal to or less than 25% maintains the true stress difference above 500 Pa. As used herein, the "hydrogen content" refers to a proportion of the number of hydrogen atoms contained in the silicon nitride film, with respect to the total number of atoms in the hydrogen-containing silicon nitride film [(the number of hydrogen atoms in the silicon nitride film/the total number of atoms in the silicon nitride film)×100].

The hydrogen-content difference of 5% to 25% can be represented by the formula (x−y)=5 to 25, where x is the percentage of hydrogen content in the region 15a, and y is the percentage of hydrogen-content in the region 15b.

As described above, the semiconductor device 1 as shown in FIG. 1 includes the MOSFET 40, and the MOSFET 30 provided opposite the MOSFET 40 with the trench 26 in between. The semiconductor device 1 also includes the second insulating layer 15, in which the region 15a is disposed between the first insulating layer 16 and the MOSFET 30, and the region 15b is disposed between the first insulating layer 16 and the MOSFET 40. This structure enables different loads to be applied on the MOSFET 30 and the MOSFET 40.

The foregoing embodiment has been described through the case where only two MOSFETs are provided. However, the present invention is not just limited to this example, and the invention also encompasses a semiconductor device provided with three or more MOSFETs.

In a semiconductor device with three or more MOSFETs, the true stresses of the first insulating layer 16 and the second insulating layer 15 influence a drain current flow in the MOSFETs, just in the same manner as described in conjunction with the semiconductor device with two MOSFETs. That is, this relationship is not just limited to the structure shown in FIG. 1. For example, in order to further improve a drain current flow, it is preferable that the respective true stresses of the first insulating layer 16 and the second insulating layer 15 be set such that a greater compressive load is applied on the P-channel MOSFET than on the N-channel MOSFET, i.e., a larger compressive stress is generated in the channel region of the P-channel MOSFET.

When the second insulating layer 15 has three or more regions of different true stresses, a numerical range of true-stress difference, and a numerical range of hydrogen-content difference are set as follows. Preferably, a true-stress difference is 500 Pa to 3 GPa between a region with the greatest true stress and a region with the smallest true stress. Preferably, a hydrogen-content difference is 5% to 25% between a region with the greatest hydrogen-content and a region with the smallest hydrogen content.

In other words, in the second insulating layer 15, it is preferable that the maximum true-stress difference fall in a range of 500 Pa to 3 GPa between regions of different true stresses. As for the hydrogen content, it is preferable that the maximum difference fall in a range of 5% to 25% between different regions of the second insulating layer 15.

In FIG. 1, the region 15a and the region 15b are formed on the sidewall surfaces and the bottom surface of the trench 26. However, the present invention is not just limited to such a structure. For example, the region 15a and the region 15b may be formed only on the side surfaces of the trench 26 but not on the bottom surface.

However, with the regions 15a and 15b formed both on the side surfaces and bottom surface of the trench 26, the loads applied on the respective MOSFETs can be regulated more accurately. This is because the applied load on the MOSFET, originating in the first insulating layer 16 can be reduced more effectively when the regions 15a and 15b are formed on both the side surfaces and bottom surface of the trench 26, rather than only on the side surfaces or bottom surface of the trench 26, provided that the true stress of the second insulating layer is the same in each case.

With the foregoing structure, the semiconductor device of the present embodiment can maximize the performance of the N-channel MOSFET and the P-channel MOSFET. It is therefore possible to increase the response speed of the N-channel MOSFET and the P-channel MOSFET, and thereby realize a high-speed and high-performance semiconductor element.

Figure 6:
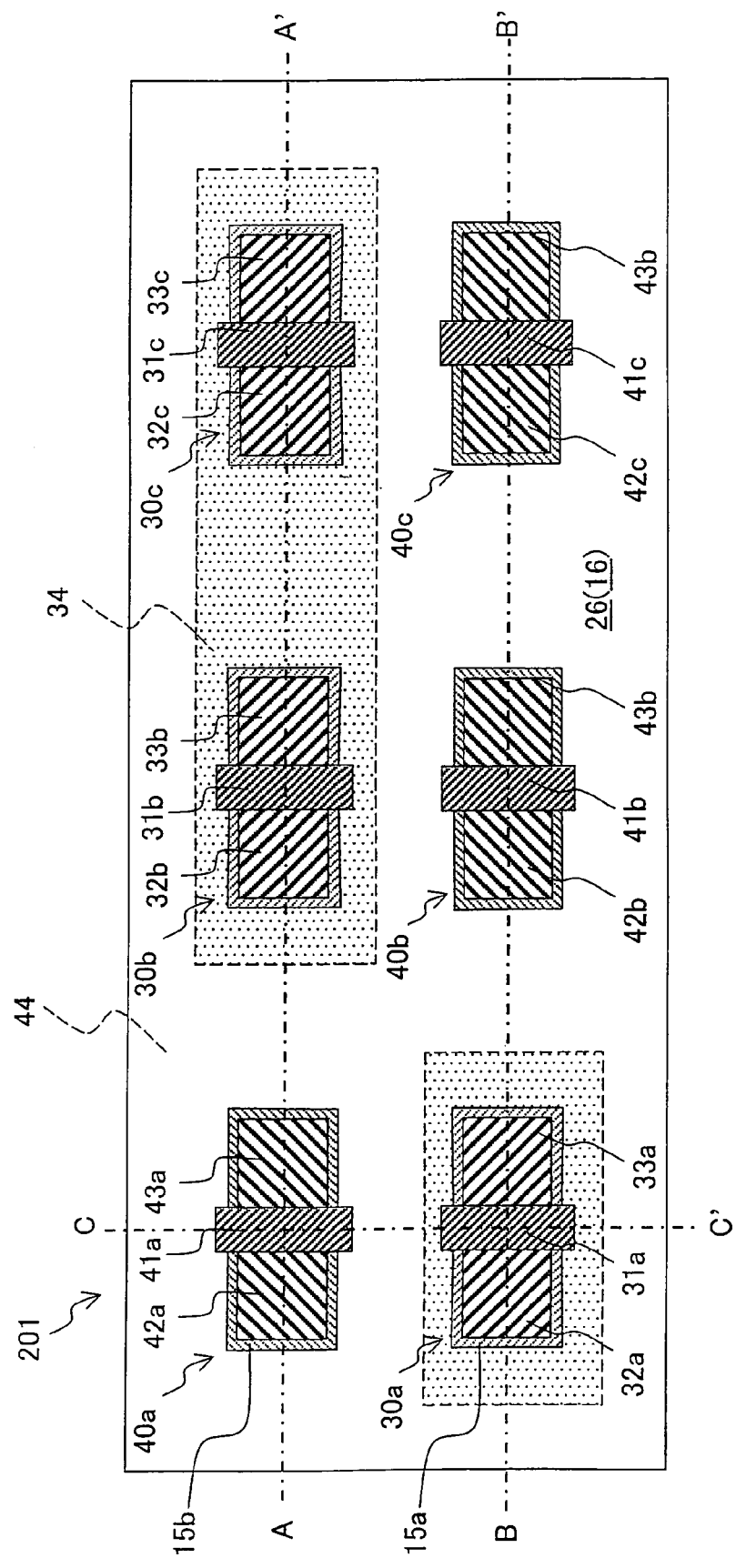
FIG. 6 is a plan view showing a semiconductor device according to one embodiment of the present invention, as viewed from the MOSFET side (from above).
Figure 7:
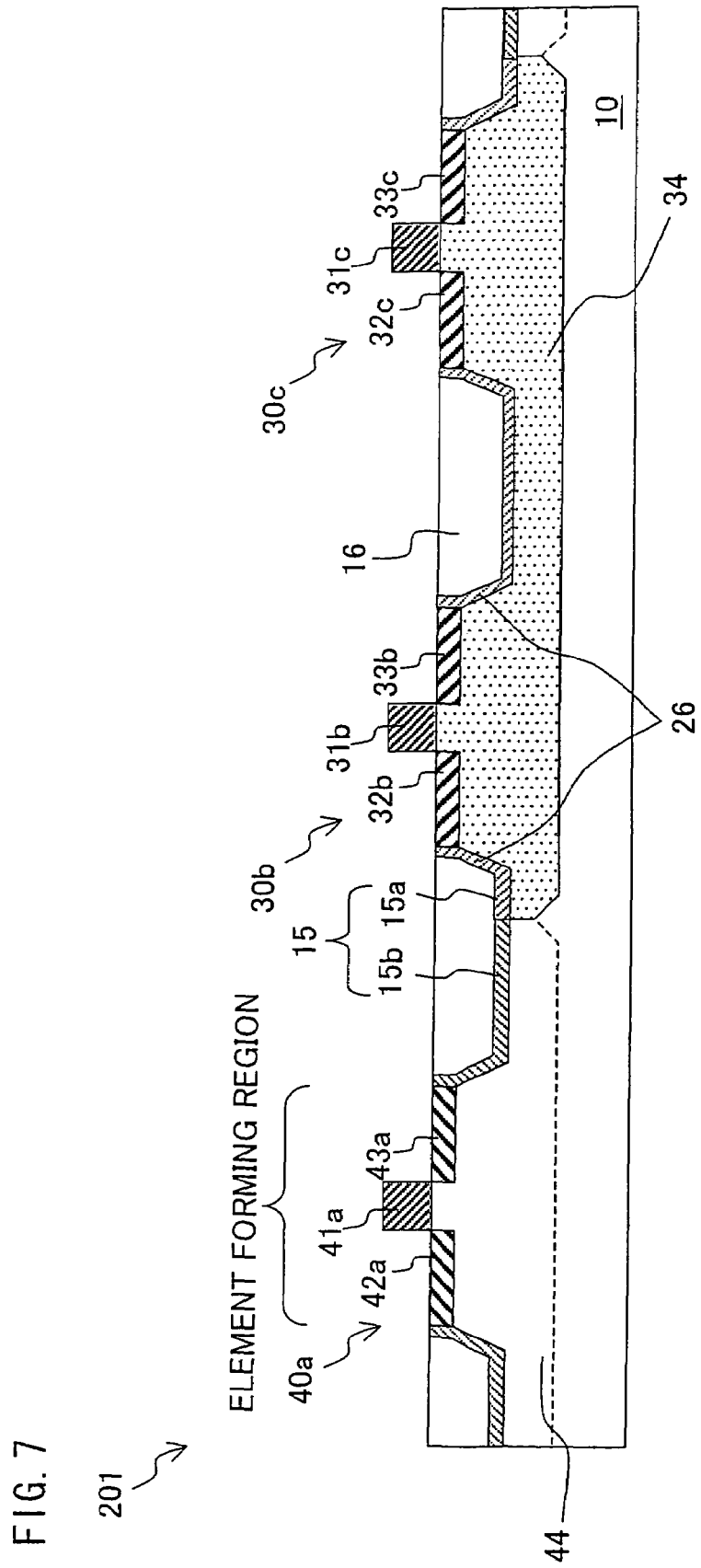
FIG. 7 is a cross sectional view of the semiconductor device shown in FIG. 6, taken along line A-A'.
Figure 8:
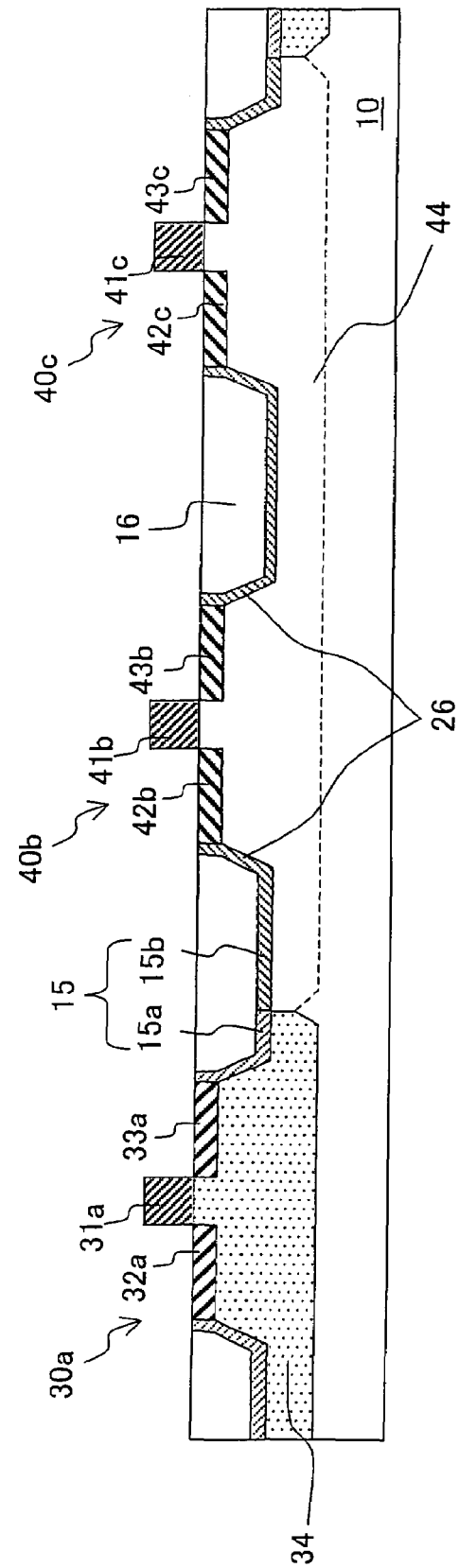
FIG. 8 is a cross sectional view of the semiconductor device shown in FIG. 6, taken along line B-B'.
Figure 9:
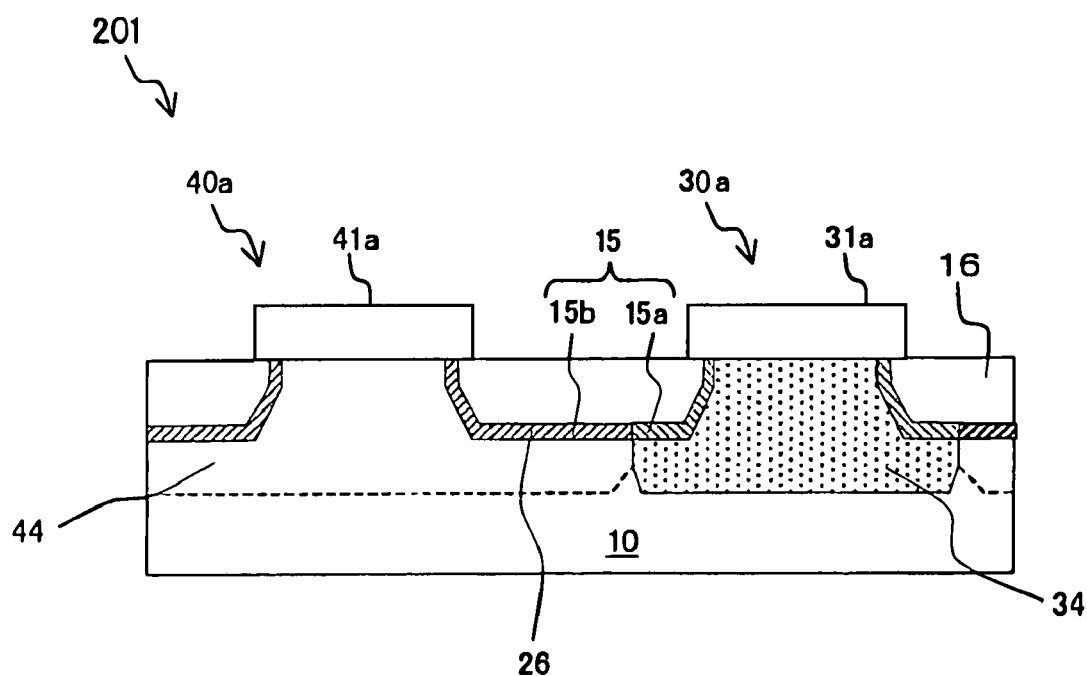
FIG. 9 is a cross sectional view of the semiconductor device shown in FIG. 6, taken along line C-C'.

In the foregoing, the semiconductor device shown in FIG. 1 was described through the case where only two MOSFETs are provided. However, the present invention is not just limited to such a construction. The following will describe a structure of a semiconductor device provided with three or more MOSFETs, with reference to FIGS. 6 through 9. FIG. 6 is a plan view showing a semiconductor device according to one embodiment of the present invention, as viewed from the MOSFET side (from above). FIG. 7 is a cross sectional view of the semiconductor device shown in FIG. 6, taken along line A-A'. FIGS. 8 and 9 are cross sectional views taken along line B-B' and C-C', respectively.

A semiconductor device 201 shown in FIGS. 6 through 9 basically has the same structure as the semiconductor device 1 shown in FIG. 1. For convenience of explanation, some of the members described with reference to FIG. 1 are not shown and explanations thereof are omitted in FIGS. 6 through 9. Further, in FIGS. 6 through 9, constituting members that are functionally equivalent to those described with reference to FIG. 1 are given the same reference numerals and explanations thereof may be omitted.

As shown in FIGS. 6 through 9, the semiconductor 201 includes a plurality of P-channel MOSFETs 30a through 30c, and a plurality of N-channel MOSFETs 40a through 40c. The MOSFETs are disposed in a matrix along x and y directions. The MOSFETs are insulated from one another by the trench 26, and the first insulating layer 16 formed in the trench 26.

The structure of each MOSFET is the same as that described with reference to FIG. 1. Specifically, the P-channel MOSFETs 30a through 30c are provided in the N-well region, and include source regions 32a through 32c, gate electrodes 31a through 31c, and drain regions 33a through 33c. The N-channel MOSFETs 40a through 40c are provided in the P-well region, and include source regions 42a through 42c, gate electrodes 41a through 41c, and drain regions 43a through 43c.

The regions 15a and 15b of the second insulating layer 15 are structurally the same as those described with reference to FIG. 1. Specifically, as shown in FIGS. 6 through 8, the region 15a is formed on the inner wall of the trench 26, in portions in contact with the N-well region. The region 15b is formed on the inner wall of the trench 26, in portions in contact with the P-well. In this embodiment, the first insulating layer 16 has a compressive stress, and the second insulating layer 15 has a tensile stress. The region 15a has a smaller tensile stress than the region 15b.

For convenience of explanation, FIG. 6 only shows the gate electrode side (upper side) at one end of the semiconductor device 201. In the semiconductor device 201, the MOSFETs 30 and 40 are surrounded by the second insulating layer 15 in the in-plane direction of the semiconductor substrate.

In the semiconductor device 201, the second insulating layer 15 (region 15b) adjoining the N-type MOSFET and the second insulating layer 15 (region 15a) adjoining the P-type MOSFET have different true stresses, in a direction of a channel length (x direction) and a direction (y direction) perpendicular to the channel length direction (FIGS. 6 through 9).

With this construction, as described with reference to FIG. 1, a greater compressive load is applied on the P-type MOSFETs 30a through 30c than on the N-type MOSFETs 40a through 40c. This enables the MOSFETs to be insulated from one another without preventing a smooth drain current flow in each MOSFET.

More specifically, in the semiconductor device 201, the second insulating layer 15 (region 15b) adjoining the N-type MOSFET and the second insulating layer 15 (region 15a) adjoining the P-type MOSFET has different true stresses, in a direction parallel to the channel length direction and along a plane dissecting the MOSFETs. Having different true stresses in the second insulating layer along the channel length direction is highly preferable in regulating a drain current flow in the MOSFETs.

Note that, in the semiconductor device 201, the region 15a adjoining the P-channel MOSFET 30a may have a different true stress from the region 15a adjoining the P-channel MOSFETs 30b and 30c. That is, the second insulating layer surrounding each MOSFET may be the same for all P-type MOSFETs, or may have different true stresses. The same can be said for the N-type MOSFETs. That is, different loads may be applied on the MOSFETs of the same type. By applying different loads, the MOSFETs of the same type can have different properties.

<2> Fabrication Method

A fabrication method according to the present embodiment is a method for fabricating a semiconductor device in which a trench and at least two MOSFETs formed on both sides of the trench are provided on a semiconductor substrate, and the method includes a first insulating layer forming step and a second insulating layer forming step. Conditions such as steps, materials, and the type of equipment used in the method are not limited, and conventional techniques known in the fabrication of semiconductor devices can be suitably used. The following describes each step in detail.

(A) First Insulating Layer Forming Step

In this step, a first insulating layer having a true stress in a certain direction is formed in a trench of the semiconductor substrate. The method by which the first insulating layer is formed is not particularly limited, and conventional techniques can be used therefor.

The material or shape of the first insulating layer is not particularly limited as long as the first insulating layer can insulate the MOSFETs formed on both sides of the trench, as described in Section <1> above.

(B) Second Insulating Layer Forming Step

This step includes two sub-steps: an insulating layer placing step of placing the insulating layer in the trench; and a stress-varying step of varying a true stress in a portion of the insulating layer by a chemical reaction process.

(B-1) Insulating Layer Placing Step

The insulating layer placing step is not particularly limited as long as it places the insulating layer in the trench. As used in conjunction with this step, the term "insulating layer" refers to an insulating layer whose true stress is varied by a chemical reaction process performed in the subsequent stress-varying step. As the insulating layer, silicon nitride is particularly preferable. This is because silicon nitride has a true stress that can readily be varied by a chemical reaction process, as described in Section <1> above.

(B-2) Stress Varying Step

The stress-varying step is not particularly limited as long as it causes a chemical reaction process in portions of the insulating layer of (B-1) to vary the true stress therein. A region of the insulating layer that has undergone such a chemical reaction process exhibits a true stress different from a true stress that had been exhibited before the reaction. This enables a load, different from one originally applied, to be applied on adjacent MOSFETs.

The chemical reaction process can be caused by, for example, irradiation of light, irradiation of an electron beam, exposure to reactive gas, and/or oxidation.

Prior to the chemical reaction process, a resist pattern may be formed in the insulating layer. The chemical reaction process can then be performed using the resist pattern as a mask. In this way, a chemical reaction process is caused only in predetermined portions of the insulating layer.

In the case of light irradiation, light of such a wavelength is irradiated in portions of the insulating layer that the chemical bonds in the irradiated portions of the insulating layer are broken and compositions of the insulating layer are changed in these portions of the insulating layer, for example. By thus changing the composition in a portion of the insulating layer, a true stress therein can be varied. Ultra violet (UV) light can be used for this purpose.

Figure 4:
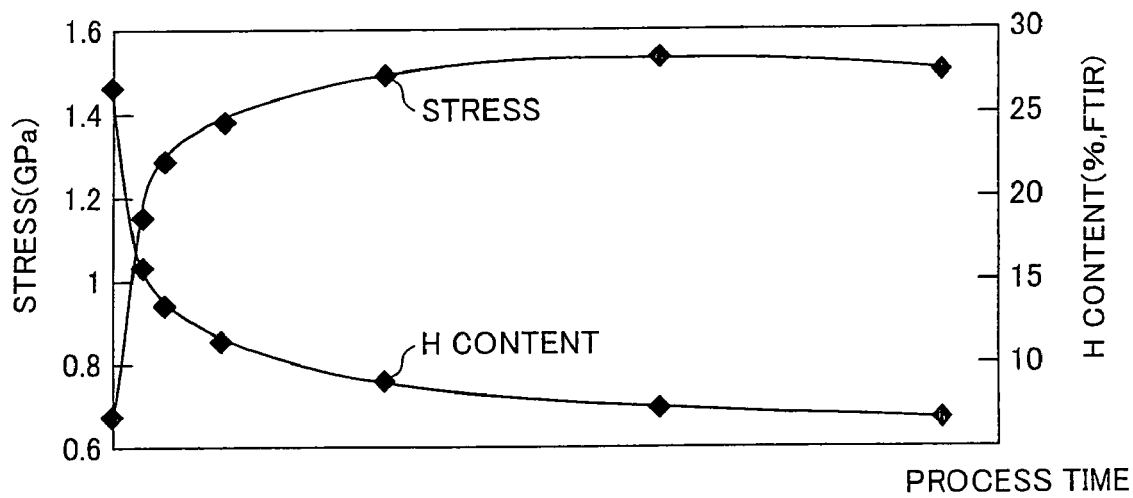
FIG. 4 is a graph representing a relation between true stress of a silicon nitride film and UV irradiation time.
Figure 5A:
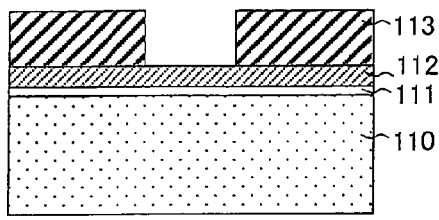
FIGS. 5(a) through 5(h) are cross sectional views showing fabrication steps of a conventional semiconductor device.
Figure 5B:
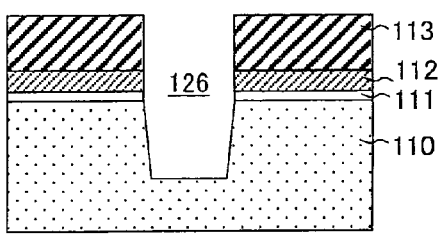
Figure 5C:
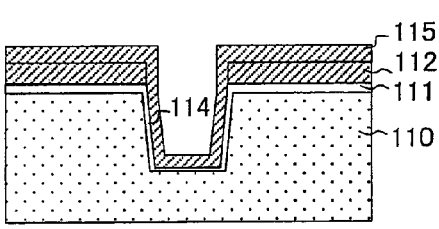
Figure 5D:
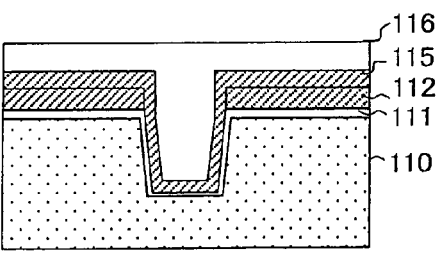
Figure 5E:
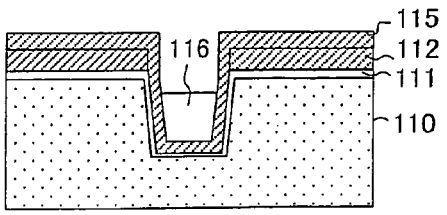
Figure 5F:
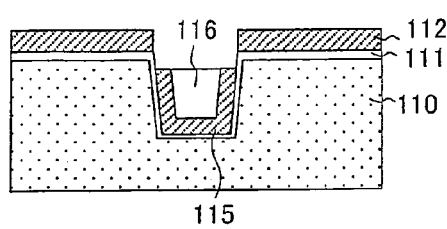
Figure 5G:
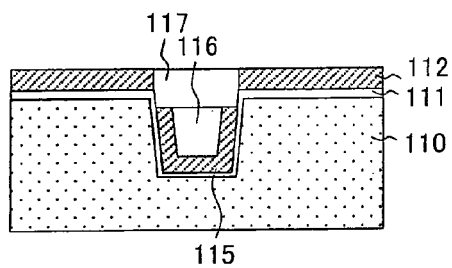
Figure 5H:
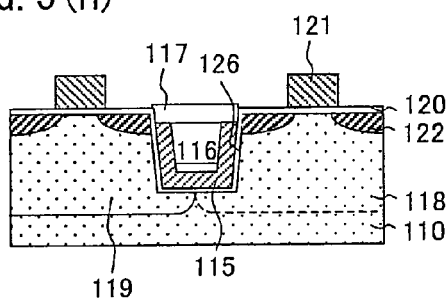

An example of changing a true stress of the insulating layer by irradiation of UV light is described in Nikkei Microdevices, page 57, Issue of May 2005, Japan. FIG. 4 is a graph representing this example, in which a true stress of the silicon nitride film varies as a function of UV irradiation time. The vertical axis represents a true stress of the silicon nitride film [stress (GPa)], and the horizontal axis represents UV irradiation time on the silicon nitride film [process time (time)]. The silicon nitride film is a PECVD grown film. It can be seen from the graph of FIG. 4 that irradiation of UV light varies the hydrogen content (%) of in the silicon nitride film and the true stress of the silicon nitride film. The hydrogen content decreases and the true stress increases as the duration of UV irradiation is increased.

Another example of light irradiation is a laser annealing process by irradiation of a laser beam. A laser annealing process breaks the chemical bonds in the irradiated regions, by creating conditions similar to those observed in heating. By thus changing the compositions in portions of the insulating layer, a true stress in these regions can be varied. As a laser beam, a high-energy laser, namely, an excimer laser can be suitably used.

As does UV light, an electron beam can also break the chemical bonds in regions it irradiates. The electron beam can be used to easily delineate patterns by directly scanning electron beams in target areas, without using a mask. Causing the chemical reaction process without using a mask is preferable in terms of reducing the number of fabrication steps.

The true stress of the insulating layer can also be varied by oxidizing the material of the insulating layer. This can be attained, for example, by exposing the insulating layer to oxygen plasma. Oxygen plasma oxidizes the material in the exposed portion of the insulating layer and thereby changes the composition of the exposed portions. As a result, the true stress is varied in these regions.

The true stress of the insulating layer can also be varied by exposing the insulating layer to reactive gas. By being exposed to reactive gas, the material of the insulating layer undergoes a chemical reaction with the reactive gas. This changes the composition in the exposed portions of insulating layer and thereby varies the true stress in these regions. For this purpose, various types of conventional reactive gases used for sputtering in thin film producing techniques can be used. Specific examples include halogen gas, $CF_4$, $CCl_4$, and $O_2$.

The chemical reaction process may be a process that changes the hydrogen content of the insulating layer. For example, the chemical reaction process may break the chemical bonds formed between hydrogen atoms (H) and non-hydrogen atoms in the insulating layer.

When the second insulating layer is a silicon nitride film, the chemical reaction process is preferably a process that breaks the Si—H bond and/or N—H bond.

When the second insulating layer is a silicon nitride film which contains $1 \times 10^{22}$ cm$^{-3}$ hydrogen atoms in N—H bonds, reducing the hydrogen concentration by mere $3 \times 10^{21}$ cm$^{-3}$ changes the film stress by +250 MPa (from −450 MPa to −200 MPa), corresponding to 55% of the original film stress. Thus, by reducing the hydrogen concentration in the N—H bonds by $5 \times 10^{20}$ cm$^{-3}$, a silicon nitride film (second insulating layer) can be formed that has undergone a stress change of 10%.

The order in which the first insulating layer forming step and the second insulating layer forming step are performed is not limited. The order of the insulating layer placing step and the stress-varying step is not limited either. However, it is preferable that the stress-varying step be performed after the insulating layer placing step. In other words, it is preferable that the insulating layer subjected to the chemical reaction process has been placed in the trench by the insulating layer placing step.

It is also preferable that the second insulating layer forming step and the first insulating layer forming step be performed in this order, as described below with reference to FIG. 2. Further, it is preferable that the insulating layer placing step, the first insulating layer forming step, and the stress varying step be performed in this order, as described below with reference to FIG. 3.

With reference to FIGS. 2 and 3, the following will describe a fabrication method of the present invention in more detail. The embodiments described with reference to FIGS. 2 and 3 are essentially the same except for the order of the second insulating layer forming step and the first insulating layer forming step, and the order of the insulating layer placing step, the first insulating layer forming step, and the stress-varying step.

[Fabrication Method 1]

FIGS. 2(a) through 2(i) are cross sectional views showing one embodiment of a fabrication method according to the present invention.

Figure 2A:
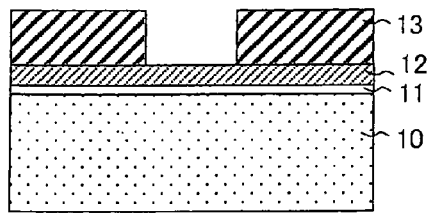
FIGS. 2(a) through 2(i) are cross sectional views showing fabrication steps in one embodiment of a fabrication method according to the present invention.

First, as shown in FIG. 2(a), a silicon oxide film 11, 2 to 20 nm thick, is formed by thermal oxidation on a semiconductor substrate 10 made of silicon. This is followed by LPCVD deposition of a silicon nitride film 12, 50 to 150 nm thick, on the silicon oxide film 11. The silicon nitride film can be deposited at 750° C., using $SiH_2$ and $NH_3$ as source gases. Then, a resist film is formed on the silicon nitride film 12, and an element-isolating resist pattern 13 is formed by exposure and development. The resist pattern 13 is formed such that the resist is formed in an element-forming region (active region), and that an opening defines an element isolation region. The opening has a width of 50 nm to 5000 nm.

Figure 2B:
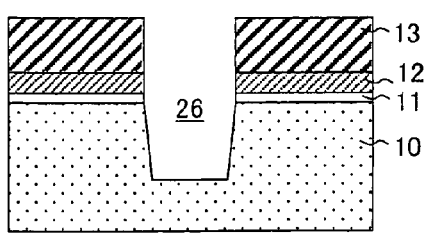

Next, as shown in FIG. 2(b), the silicon nitride film 12, the silicon oxide film 11, and the semiconductor substrate 10 are successively etched to form an element-isolating trench 26, using the resist pattern 13 as a mask. The semiconductor substrate 10 is preferably etched to 100 nm to 500 nm. For the etching of the silicon nitride film 12 and the silicon oxide film 11, a mixture of $CF_4$, $CHF_3$, Ar, and $O_2$ gases can be used as an etching gas. For the etching of the semiconductor substrate 10, a mixture of $Cl_2$ and $O_2$ gases is used, for example. After etching, the resist pattern 13 is removed.

Figure 2C:
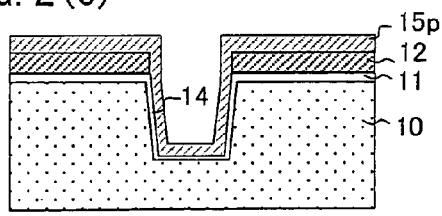

Thereafter, as shown in FIG. 2(c), the semiconductor substrate 10 exposed on the surface of the trench 26 is thermally oxidized on the surface to form a silicon oxide film 14. The silicon oxide film 14 preferably has a thickness of 1 nm to 20 nm. By the thermal oxidation, all the silicon surfaces exposed in the trench 26 are covered with the silicon oxide film 14.

Next, an insulating layer 15p, to be the second insulating layer, is formed so as to cover the silicon oxide film 14 and the silicon nitride film 12 (insulating layer placing step). The insulating layer 15p is a silicon nitride film. The silicon nitride film can be formed by depositing it to 5 nm to 100 nm by an LPCVD method at a temperature of 750° C., using $SiH_2$, $Cl_2$, and $NH_3$ as source gases, for example. Under these conditions, a weak tensile stress of, for example, no greater than 500 MPa is rendered as a true stress of the insulating layer 15p. In the following, for convenience of explanation, the silicon oxide films 11 and 14 may be collectively referred to as silicon oxide films 11.

Figure 2D:
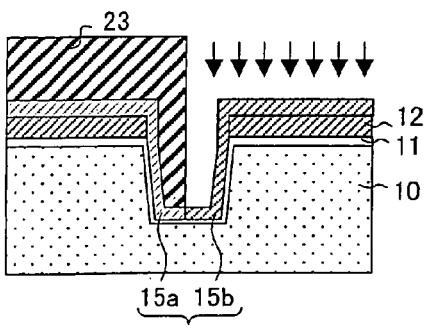

Next, as shown in FIG. 2(d), a resist film is formed, which is exposed and developed to form a chemical-reaction resist pattern 23, surrounding the element-forming region for the N-channel MOSFET. The resist pattern 23 is formed such that an end thereof lies on the element isolation region. That is, an end of the resist pattern 23 is formed inside the trench 26, or preferably on the bottom surface of the trench 26.

Using the resist pattern 23 as a mask, the insulating layer 15p at the resist opening is subjected to the chemical reaction process (as indicated by arrows in the figure) (stress-varying step). When the chemical reaction process is performed by irradiation of UV light, chemical reactions increase the tensile stress in a treated region 15b. A region masked by the resist of the resist patter 23 and did not undergo chemical reactions remain as a region 15a. As a result, different true stresses are rendered in the region 15a and the region 15b. The resist pattern 23 is then removed. The insulating layer 15p after the stress-varying step becomes a second insulating layer 15.

Figure 2E:
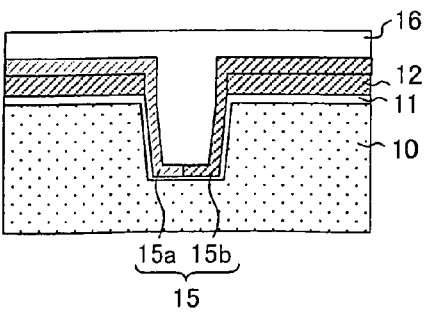

Next, as shown in FIG. 2(e), a first insulating layer 16 is formed on the film-bearing side of the semiconductor substrate 10 (first insulating layer forming step). In this embodiment, the first insulating layer 16 is a silicon oxide film, and is formed to a thickness of, for example, 300 nm to 700 nm by HDP-CVD (high density plasma chemical vapor deposition method) so as to fill the trench. The HDP-CVD is performed with $SiH_4$, $O_2$, and $H_2$ gases, for example.

Figure 2F:
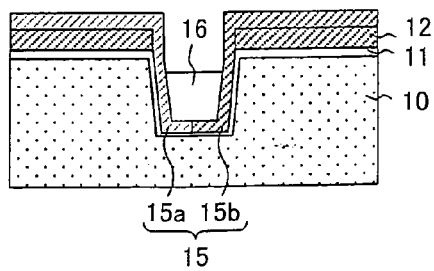

Next, as shown in FIG. 2(f), surface irregularities on the first insulating layer 16 are improved by chemical machine polishing, without exposing the second insulating layer 15. The first insulating layer 16 is then etched back. Chemical machine polishing can be performed with an abrasive that contains silicon oxide or cerium oxide as abrasive coatings. Etching is made with, for example, hydrofluoric acid, which removes the first insulating layer 16 at an upper part of the trench 26.

Figure 2G:
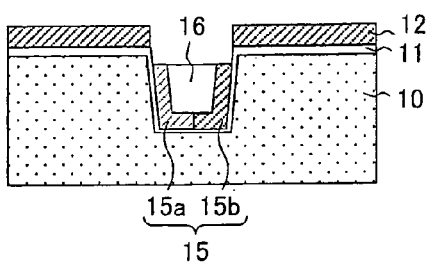

Thereafter, as shown in FIG. 2(g), the exposed portion of the second insulating layer 15 is removed by a phosphoric acid ($H_3PO_4$) boil. Here, the silicon nitride film 12 serves as a stopper in the chemical machine polishing of the next step performed to fill the trench. As such, the amount of etching is adjusted so that the silicon nitride film 12 will not be removed by the etching. Inside the trench 26, the first insulating layer 16 (silicon oxide film) serves as a mask, and the second insulating layer 15 remains on the side and bottom surfaces of the trench 26.

Figure 2H:
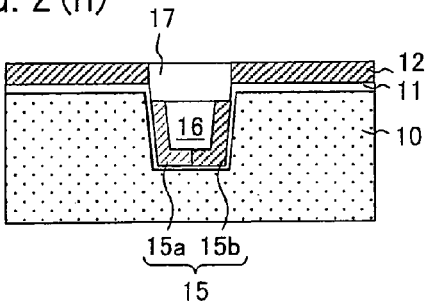

Next, as shown in FIG. 2(h), a CVD oxidation film is deposited on the entire surface on the film-bearing side of the semiconductor substrate 10. In this manner, a silicon oxide film 17, 300 to 700 nm thick, is formed to fill the trench. This is followed by planarization etching using chemical machine polishing, which removes the silicon oxide film 17 in the element-forming region and exposes the surface of the silicon nitride film 12.

Figure 2I:
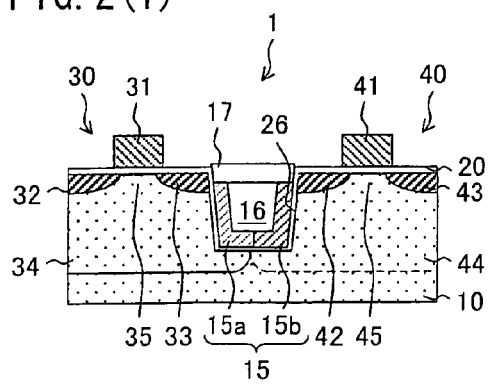

Thereafter, as shown in FIG. 2(i), the silicon nitride film 12 is removed by a phosphoric acid ($H_3PO_4$) boil, followed by removal of the silicon oxide film 11 with hydrofluoric acid.

With the silicon oxide film removed, annealing is performed for 30 minutes at 950° C. so as to increase the density of the silicon oxide films (first insulating layer 16 and the silicon oxide film 17).

Next, well implantation is performed for the N-type MOSFET region and the P-type MOSFET region, so as to form a well region 44 and a well region 34, respectively. This is followed by formation of a gate oxidizing film 20 and gate electrodes 31 and 41. Then, by source and drain implantation, source regions 32 and 42 and drain regions 33 and 43 are formed. As a result, a semiconductor device 1 is formed in which the P-channel MOSFET 30 and the N-channel MOSFET 40 are insulated from each other by the first insulating layer 16.

By annealing, the first insulating layer 16 generates a compressive stress, which applies a compressive load on the MOSFETs 30 and 40. By the chemical reaction process, the region 15b of the second insulating layer 15 produced by the foregoing method is rendered a strong tensile stress. As a result, the compressive stress of the first insulating layer 16 is greatly reduced. In this way, the undesirable effect of the compressive load on the mobility of the N-channel MOSFET can be relieved in the MOSFET 40 adjoining the region 15b.

The region 15a is not subjected to the chemical reaction process and therefore has only a weak tensile stress. As such, the effect of reducing the compressive load applied on the MOSFET 30 by the first insulating layer 16 is not as strong in the region 15a as in the region 15b. Thus, the region 15a does not interfere with the compressive stress effect of increasing the mobility of the P-channel MOSFET.

[Fabrication Method 2]

Referring to FIGS. 3(a) through 3(i), the following will describe another embodiment of a fabrication method according to the present invention. FIGS. 3(a) through 3(i) are cross sectional views showing steps in another embodiment of a fabrication method according to the present invention.

Figure 3A:
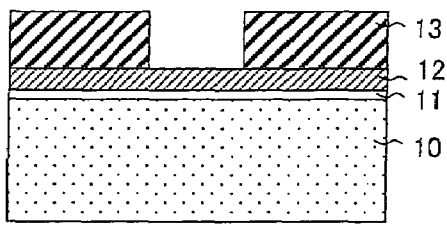
FIGS. 3(a) through 3(i) are cross sectional views showing fabrication steps in another embodiment of a fabrication method according to the present invention.
Figure 3B:
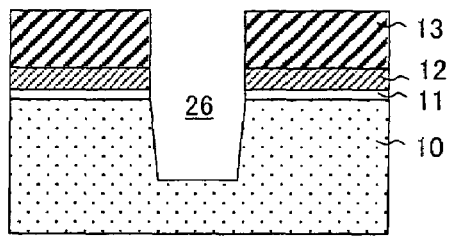
Figure 3C:
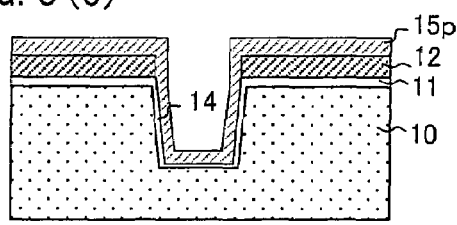

First, the steps shown in FIGS. 3(a) through 3(c) are performed. These steps will not be explained since they are the same as the steps described with reference to FIGS. 2(a) through 2(c) in the foregoing [Fabrication Method 1] section.

Figure 3D:
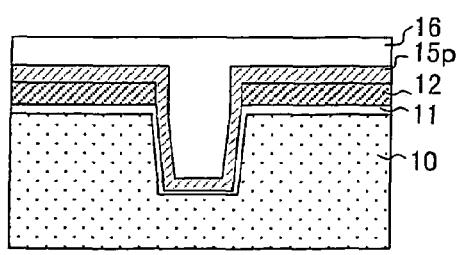

Next, a step analogous to the step described with reference to FIG. 2(e) is performed, as shown in FIG. 3(d). Specifically, a first insulating layer 16 is formed on the entire surface of the film-bearing side of the semiconductor substrate 10 (first insulating layer forming step).

Figure 3E:
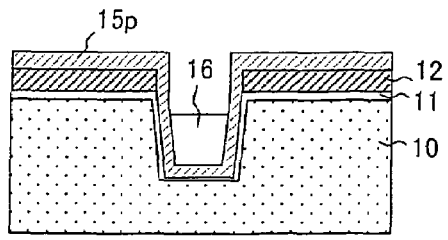

Thereafter, by a step analogous to the step shown in FIG. 2(f), the first insulating layer 16 is etched back, as shown in FIG. 3(e).

Figure 3F:
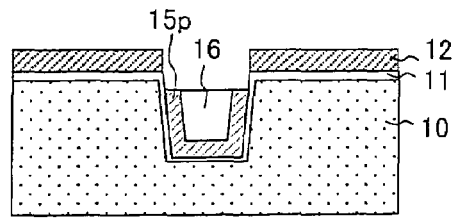

By a step analogous to the step shown in FIG. 2(g), the exposed portions of the second insulating layer 15 are removed, as shown in FIG. 3(f).

Figure 3G:
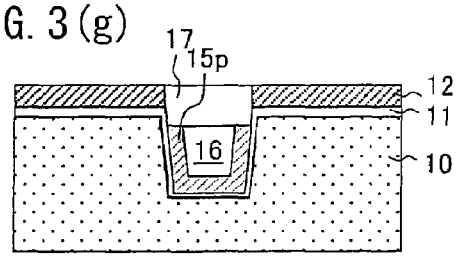

By a step analogous to the step shown in FIG. 2(h), the silicon oxide film 17 is formed, the silicon oxide film 17 in the element-forming region is removed, and the surface of the silicon nitride film 12 is exposed, as shown in FIG. 3(g).

Figure 3H:
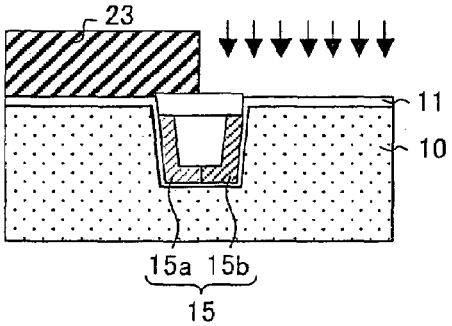

Next, by a step analogous to the step shown in FIG. 2(d), the resist pattern 23 is formed that surrounds the element-forming region for the N-channel MOSFET, as shown in FIG. 3(h). The resist pattern 23 is formed such that an end thereof lies on the element isolation region. That is, the resist pattern 23 extends above the bottom surface of the trench 26, in a direction perpendicular to the direction of thickness of the semiconductor substrate 1.

Then, using the resist pattern 23 as a mask, the insulating layer 15p at the resist opening is subjected to a chemical reaction process (as indicated by arrows in the figure) (stress-varying step). As a result, there are formed a region 15a, which was masked by the resist pattern 23 and was not subjected to the chemical reaction process, and a region 15b, which was subjected to the chemical reaction process at the resist opening. As described in the foregoing [Fabrication Method 1] section, the chemical reaction process increases the tensile stress in the region 15b. The chemical reaction process may be followed by well implantation for the N-type MOSFET region and the P-type MOSFET region.

Figure 3I:
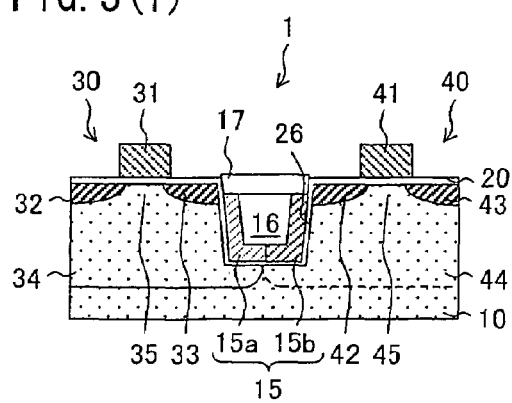

Next, by a step analogous to the step shown in FIG. 2(i), the silicon nitride film 12 and the silicon oxide film 11 are removed, as shown in FIG. 3(i). With the silicon oxide film removed, the density of the silicon oxide films (first insulating layer 16 and the silicon oxide film 17) is increased, as described above.

Next, the P-channel MOSFET 30 and the N-channel MOSFET 40 are formed in steps analogous to those described above, so as to fabricate a semiconductor device 1.

In this embodiment, the stress-varying step (FIG. 3(h)) is performed after formation of the shallow trench, i.e., after the first insulating layer forming step shown in FIG. 3(d). This enables the stress-varying step to be performed simultaneously with the well implantation, thereby reducing the number of photo steps and the turn around time (TAT).

If the stress-varying step and the well implantation were to be performed separately, a photo step for patterning the resist would be required for each of these procedures. In the present embodiment, however, only a single photo step is required because the stress-varying step and the well implantation are preformed continuously, using the same resist pattern.

As described above, a semiconductor device according to the present invention includes: a semiconductor substrate; a trench formed on the semiconductor substrate; at least two MOSFETs provided on the semiconductor substrate with the trench in between; a first insulating layer, provided in the trench, insulating the MOSFETs; and a second insulating layer, provided at least between the first insulating layer and the MOSFETs, having a true stress opposite to a true stress of the first insulating layer, the true stress of the second insulating layer being different in (i) a region formed between one MOSFET and the first insulating layer and (ii) a region formed between another MOSFET and the first insulating layer.

According to this structure, the true stress of the second insulating layer relieves the applied load on each MOSFET, originating in the true stress of the first insulating layer. This relieves the stress generated in each MOSFET.

The load applied on each MOSFET is dependent on the sum of true stresses of the first insulating layer and the second insulating layer. According to this structure, the true stress of the second insulating layer differs in (i) a region formed between one MOSFET and the first insulating layer and (ii) a region formed between another MOSFET and the first insulating layer. This enables different loads to be applied on different MOSFETs. That is, a generated stress in each MOSFET can be independently controlled. This allows the drain current to be controlled for each MOSFET, thereby controlling the response speed of each MOSFET.

Further, a semiconductor device according to the present invention may be adapted to include: a semiconductor substrate; a trench formed on the semiconductor substrate; at least two MOSFETs provided on the semiconductor substrate with the trench in between; a first insulating layer, provided in the trench, insulating the MOSFETs; and a second insulating layer, provided at least between the first insulating layer and the MOSFETs, having a true stress opposite to a true stress of the first insulating layer, the true stress of the second insulating layer being different in (i) a region formed between one MOSFET and the first insulating layer and (ii) a region formed between another MOSFET, disposed on an opposite side of the trench, and the first insulating layer.

According to this structure, the true stress of the second insulating layer differs in (i) a region formed between one MOSFET and the first insulating layer and (ii) a region formed between another MOSFET, disposed on an opposite side of the trench, and the first insulating layer. This enables different loads to be applied on the two MOSFETs provided on both sides of the trench. That is, a generated stress in each MOSFET can be independently controlled. This allows the drain current to be controlled for each MOSFET, thereby controlling the response speed of each MOSFET.

A semiconductor device according to the present invention may be adapted to include: a semiconductor substrate; a trench formed on the semiconductor substrate; at least two MOSFETs provided on the semiconductor substrate with the trench in between; a first insulating layer, provided in the trench, insulating the MOSFETs; and a second insulating layer, provided at least between the first insulating layer and the MOSFETs, having a true stress opposite to a true stress of the first insulating layer, the at least two MOSFETs including a P-channel MOSFET and an N-channel MOSFET, and the true stress of the second insulating layer being different in (i) a region formed between the N-channel MOSFET and the first insulating layer and (ii) a region formed between the P-channel MOSFET and the first insulating layer.

According to this structure, the true stress of the second insulating layer differs in (i) a region formed between the N-channel MOSFET and the first insulating layer and (ii) a region formed between the P-channel MOSFET and the first insulating layer. This enables different loads to be applied on the N-channel MOSFET and the P-channel MOSFET. That is, a generated stress in each type of MOSFET can be independently controlled. This allows the drain current to be controlled for each MOSFET, thereby controlling the response speed of each MOSFET.

In a semiconductor device of the present invention, it is preferable that the second insulating layer include silicon nitride.

Silicon nitride can easily undergo changes in true stress by a chemical reaction process. Thus, according to the foregoing structure, the true stress can easily be varied for each different region of the second insulating layer.

In a semiconductor device of the present invention, it is preferable that a maximum difference of true stress that varies between the regions of the second insulating layer fall in a range of 500 Pa to 3 GPa.

This is preferable because it enables a suitable load to be applied on each MOSFET.

In a semiconductor device of the present invention, it is preferable that a maximum difference of hydrogen content that vary between the regions of the second insulating layer falls in a range of 5% to 25%.

This is preferable because it confines a true stress difference in a range of 500 Pa to 3 GPa.

In a semiconductor device of the present invention, it is preferable that the second insulating layer be formed between the first insulating layer and inner sidewall surfaces of the trench, and between the first insulating layer and an inner bottom wall surface of the trench.

According to the foregoing structure, the applied load on the MOSFET, originating in the true stress of the first insulating layer can be reduced more effectively, as compared with the case where the second insulating layer is formed only on the inner side wall surfaces or bottom surface of the trench. That is, the loads applied on the respective MOSFETs, originating in the true stress of the first insulating layer can be reduced more effectively when the second insulating layer is formed on both the side surfaces and the bottom surface of the trench, rather than only on the side surfaces or bottom surface of the trench, provided that the true stress of the second insulating layer is the same in each case.

More specifically, in a semiconductor device of the present invention, the true stress of the first insulating layer is a compressive stress, and the true stress of the second insulating layer is a tensile stress, and the tensile stress of the second insulating layer is smaller in the region formed between the first insulating layer and the P-channel MOSFET than in the region formed between the first insulating layer and the N-channel MOSFET.

According to the foregoing structure, the compressive load applied on the P-channel MOSFET, originating in the compressive stress of the first insulating layer is not reduced as much as the compressive load applied on the N-channel MOSFET. This prevents the drain current from being decreased in the N-channel MOSFET and the P-channel MOSFET.

In other words, the compressive load applied on the P-channel MOSFET is greater than the compressive load applied on the N-channel MOSFET. This ensures desirable hole mobility in the P-channel MOSFET, and desirable electron mobility in the N-channel MOSFET.

A semiconductor device of the present invention may be adapted so that the true stress of the first insulating layer is a tensile stress, and the true stress of the second insulating layer is a compressive stress, and that the compressive stress of the second insulating layer is greater in the region formed between the first insulating layer and the P-channel MOSFET than in the region formed between the first insulating layer and the N-channel MOSFET.

According to the foregoing structure, the tensile load applied on the N-channel MOSFET, originating in the tensile stress of the first insulating layer is not reduced as much as the tensile load applied on the P-channel MOSFET. This prevents the drain current from being decreased both in the N-channel MOSFET and the P-channel MOSFET.

In other words, the tensile load applied on the N-channel MOSFET is greater than the tensile load applied on the P-channel MOSFET. This ensures desirable hole mobility in the P-channel MOSFET, and desirable electron mobility in the N-channel MOSFET.

Further, a semiconductor device of the present invention may be adapted so that at least a trench, an N-channel MOSFET, and a P-channel MOSFET disposed opposite the N-channel MOSFET with the trench in between are formed on a semiconductor substrate, and the semiconductor device may be adapted to include a first insulating layer, provided in the trench, for insulating the N-channel MOSFET and the P-channel MOSFET from each other and having a compressive stress; and a second insulating layer, provided at least between the first insulating layer and the N-channel MOSFET, and between the first insulating layer and the P-channel MOSFET, having a tensile stress, the tensile stress of the second insulating layer being smaller in a region formed between the first insulating layer and the P-channel MOSFET than in a region formed between the first insulating layer and the N-channel MOSFET.

Further, a semiconductor device of the present invention may be adapted so that at least a trench, an N-channel MOSFET, and a P-channel MOSFET disposed opposite the N-channel MOSFET with the trench in between are formed on a semiconductor substrate, and the semiconductor device may be adapted to include a first insulating layer, provided in the trench, for insulating the N-channel MOSFET and the P-channel MOSFET from each other and having a tensile stress; and a second insulating layer, provided at least between the first insulating layer and the N-channel MOSFET, and between the first insulating layer and the P-channel MOSFET, having a compressive stress, the compressive stress of the second insulating layer being smaller in a region formed between the first insulating layer and the P-channel MOSFET than in a region formed between the first insulating layer and the N-channel MOSFET.

The present invention provides a method for fabricating a semiconductor device in which a trench and at least two MOSFETs provided on both sides of the trench are formed on a semiconductor substrate, the method comprising the steps of: forming, in the trench, a first insulating layer having a true stress in a certain direction; forming, between the first insulating layer and inner walls of the trench, a second insulating layer having a true stress opposite the true stress of the first insulating layer, the step of forming a second insulating layer including a step of placing an insulating layer in the trench, and a step of varying a true stress in a portion of the insulating layer by a chemical reaction process.

According to this method, the stress-varying step forms regions of different true stresses in the second insulating layer.

Further, according to the foregoing method, regions of different true stresses in the insulating layer are continuously formed by a chemical reaction process that is performed in portions of the second insulating layer, instead of forming separate insulating layers having different true stresses. This simplifies the fabrication steps and improves productivity.

A fabrication method of the present invention may be adapted so that the chemical reaction process is a process or a combination of processes selected from the group consisting of: irradiation of light; irradiation of an electron beam; exposure to reactive gas; and oxidation.

According to this method, the composition of the insulating film can be changed by irradiation of light, irradiation of an electron beam, exposure to reactive gas, or oxidation. A region that has undergone a composition change shows a change in true stress, with the result that regions of different true stresses can be formed. The chemical reaction process can also be performed by a combination of these techniques.

A fabrication method of the present invention may be adapted so that the chemical reaction process is a process that breaks chemical bonds between hydrogen atoms and non-hydrogen atoms contained in the insulating layer.

According to this method, the composition of the insulating layer is changed by breaking the chemical bonds formed between hydrogen atoms and other atoms contained in the insulating layer. A region that has undergone a composition change shows a change in true stress, with the result that regions of different true stresses can be formed.

A fabrication method of the present invention may be adapted so that, in the stress-varying step, a portion of the insulating layer is subjected to the chemical reaction process by masking a resist pattern formed on the insulating layer.

According to the foregoing method, regions subjected to the chemical reaction process in the stress-varying step can easily be adjusted to a desired shape and size. The method as set forth in original claim 18, wherein the step of forming a second insulating layer and the step of forming a first insulating layer are performed in this order.

A fabrication method according to the present invention may be adapted so that the step of placing an insulating layer, the step of forming a first insulating layer, and the step of varying a stress are performed in this order.

A fabrication method of the present invention may be adapted so that the step of placing a second insulating layer, the step of forming a first insulating layer, and the chemical reaction process are performed by irradiation of light and/or irradiation of an electron beam.

A fabrication method of the present invention may be adapted so that the second insulating layer includes silicon nitride, and that the chemical reaction process is a process that breaks Si—H bonds and/or N—H bonds in the silicon nitride.

The present invention is not limited to the description of the embodiments above, but may be altered by a skilled person within the scope of the claims. An embodiment based on a proper combination of technical means disclosed in different embodiments is encompassed in the technical scope of the present invention.

What is claimed is:

1. A semiconductor device comprising: a semiconductor substrate; a trench formed on the semiconductor substrate; at least two MOSFETs provided on the semiconductor substrate with the trench in between; a first insulating layer, provided in the trench, insulating the MOSFETs; and a second insulating layer, provided at least between the first insulating layer and the MOSFETs, having a true stress opposite to a true stress of the first insulating layer, the true stress of the second insulating layer being different in (i) a region formed between one MOSFET and the first insulating layer and (ii) a region formed between another MOSFET and the first insulating layer, wherein the second insulating layer includes silicon nitride, and wherein a maximum difference of hydrogen content that varies between said regions of the second insulating layer falls in a range of 5% to 25%.

2. A semiconductor device comprising: a semiconductor substrate; a trench formed on the semiconductor substrate; at least two MOSFETs provided on the semiconductor substrate with the trench in between; a first insulating layer, provided in the trench, insulating the MOSFETs; and a second insulating layer, provided at least between the first insulating layer and the MOSFETs, having a true stress opposite to a true stress of the first insulating layer, the true stress of the second insulating layer being different in (i) a region formed between one MOSFET and the first insulating layer and (ii) a region formed between another MOSFET, disposed on an opposite side of the trench, and the first insulating layer, wherein the second insulating layer includes silicon nitride, and wherein a maximum difference of hydrogen content that varies between said regions of the second insulating layer falls in a range of 5% to 25%.

3. A semiconductor device comprising: a semiconductor substrate; a trench formed on the semiconductor substrate; at least two MOSFETs provided on the semiconductor substrate with the trench in between; a first insulating layer, provided in the trench, insulating the MOSFETs; and a second insulating layer, provided at least between the first insulating layer and the MOSFETs, having a true stress opposite to a true stress of the first insulating layer, said at least two MOSFETs including a P-channel MOSFET and an N-channel MOSFET, and the true stress of the second insulating layer being different in (i) a region formed between the N-channel MOSFET and the first insulating layer and (ii) a region formed between the P-channel MOSFET and the first insulating layer, wherein the second insulating layer includes silicon nitride, and wherein a maximum difference of hydrogen content that varies between said regions of the second insulating layer falls in a range of 5% to 25%.

4. A semiconductor device comprising: a semiconductor substrate; a trench formed on the semiconductor substrate; at least two MOSFETs provided on the semiconductor substrate with the trench in between; a first insulating layer, provided in the trench, insulating the MOSFETs; and a second insulating layer, provided at least between the first insulating layer and the MOSFETs, having a true stress opposite to a true stress of the first insulating layer, said at least two MOSFETs including a P-channel MOSFET and an N-channel MOSFET, and the true stress of the second insulating layer being different in (i) a region formed between the N-channel MOSFET and the first insulating layer and (ii) a region formed between the P-channel MOSFET and the first insulating layer, wherein the true stress of the first insulating layer is a tensile stress, and the true stress of the second insulating layer is a compressive stress, and wherein the compressive stress of the second insulating layer is greater in the region formed between the first insulating layer and the P-channel MOSFET than in the region formed between the first insulating layer and the N-channel MOSFET.

5. A semiconductor device in which at least a trench, an N-channel MOSFET, and a P-channel MOSFET disposed opposite the N-channel MOSFET with the trench in between are formed on a semiconductor substrate, said semiconductor device comprising:

a first insulating layer, provided in the trench, for insulating the N-channel MOSFET and the P-channel MOSFET from each other and having a tensile stress; and a second insulating layer, provided at least between the first insulating layer and the N-channel MOSFET, and between the first insulating layer and the P-channel MOSFET, having a compressive stress, the compressive stress of the second insulating layer being greater in a region formed between the first insulating layer and the P-channel MOSFET than in a region formed between the first insulating layer and the N-channel MOSFET.

6. A method for fabricating a semiconductor device of claims 1, 2, 3, 4 or 5 in which a trench and at least two MOSFETs provided on both sides of the trench are formed on a semiconductor substrate, the method comprising the steps of:

forming, in the trench, a first insulating layer having a true stress in a certain direction;

forming, between the first insulating layer and inner walls of the trench, a second insulating layer having a true stress opposite the true stress of the first insulating layer, said step of forming a second insulating layer including a step of placing an insulating layer in the trench, and a step, of varying a true stress in a portion of the insulating layer by a chemical reaction process.

7. The method as set forth in claim 6, wherein the chemical reaction process is a process or a combination of processes selected from the group consisting of: irradiation of light; irradiation of an electron beam; exposure to reactive gas; and oxidation.

8. The method as set forth in claim 6, wherein the chemical reaction process is a process that breaks chemical bonds between hydrogen atoms and non-hydrogen atoms contained in the insulating layer.

9. The method as set forth in claim 6, wherein, in the stress-varying step, a portion of the insulating layer is subjected to the chemical reaction process by masking a resist pattern formed on the insulating layer.

10. The method as set forth in claim 6, wherein the step of forming a second insulating layer and the step of forming a first insulating layer are performed in this order.

11. The method as set forth in claim 6, wherein the step of placing an insulating layer, the step of forming a first insulating layer, and the stress-varying step are performed in this order.

12. The method as set forth in claim 6, wherein the step of placing an insulating layer, the step of forming a first insulating layer, and the stress-varying step are performed in this order, and wherein the chemical reaction process is performed by irradiation of light and/or irradiation of an electron beam.

13. The method as set forth in claim 6, wherein the second insulating layer includes silicon nitride, and wherein the chemical reaction process is a process that breaks Si—H bonds and/or N—H bonds in the silicon nitride.

* * * * *